United States Patent
Zhang et al.

(10) Patent No.: US 10,224,696 B2
(45) Date of Patent: *Mar. 5, 2019

(54) OPTICAL MODULE

(71) Applicants: Hisense Broadband MultiMedia Technologies Co., Ltd., Qingdao, Shandong (CN); Hisense USA Corp., Suwanee, GA (US); Hisense International Co., Ltd., Qingdao, Shandong (CN)

(72) Inventors: Qiang Zhang, Shandong (CN); Qisheng Zhao, Shandong (CN); Chenghao Jin, Shandong (CN)

(73) Assignees: HISENSE BROADBRAND MULTIMEDIA TECHNOLOGIES CO., LTD., Qingdao (CN); HISENSE USA CORPORATION, Suwanee, GA (US); HISENSE INTERNATIONAL CO., LTD., Qingdao (CN)

( * ) Notice: Subject to any disclaimer, the term of this patent is extended or adjusted under 35 U.S.C. 154(b) by 0 days.

This patent is subject to a terminal disclaimer.

(21) Appl. No.: 15/839,543

(22) Filed: Dec. 12, 2017

(65) Prior Publication Data
US 2018/0102629 A1    Apr. 12, 2018

Related U.S. Application Data

(63) Continuation of application No. 14/886,906, filed on Oct. 19, 2015, now Pat. No. 9,882,350.

(30) Foreign Application Priority Data

Mar. 25, 2015    (CN) .......................... 2015 1 0133857

(51) Int. Cl.
*H01S 5/068*    (2006.01)
*H01S 5/022*    (2006.01)
(Continued)

(52) U.S. Cl.
CPC ...... *H01S 5/06804* (2013.01); *H01S 5/02212* (2013.01); *H01S 5/02284* (2013.01); *H01S 5/02415* (2013.01); *H01S 5/4012* (2013.01)

(58) Field of Classification Search
CPC .............. H01S 5/06804; H01S 5/4012; H01S 5/02212; H01S 5/02284; H01S 5/02415
See application file for complete search history.

(56) References Cited

U.S. PATENT DOCUMENTS

| 4,399,541 A | 8/1983 | Kovats et al. |
| 5,704,213 A * | 1/1998 | Smith ................ G05D 23/1934 165/290 |

(Continued)

FOREIGN PATENT DOCUMENTS

| CN | 103490269 A | 1/2014 |
| CN | 203562639 U | 4/2014 |

OTHER PUBLICATIONS

Search Report and First Office Action for Chinese Application No. 201510133857.5, dated Jan. 4, 2017.

*Primary Examiner* — Xinning (Tom) Niu
(74) *Attorney, Agent, or Firm* — Brinks Gilson & Lione

(57) ABSTRACT

An optical module includes: a first thermoelectric cooler (TEC) disposed at least partially inside a laser, a second TEC is disposed on a housing of the laser, and a micro control unit (MCU). The first TEC is configured to perform heating or cooling according to an enabling signal input by aMCU. The second TEC is configured to perform heating or cooling according to an enabling signal input by the MCU. The MCU is configured to determine whether to input an enabling signal or a disabling signal to the first TEC and the second TEC according to a size of operating current input by a drive circuit of a laser chip to the laser chip.

17 Claims, 6 Drawing Sheets

(51) Int. Cl.
*H01S 5/024* (2006.01)
*H01S 5/40* (2006.01)

(56) References Cited

U.S. PATENT DOCUMENTS

| | | | |
|---|---|---|---|
| 7,940,822 B1* | 5/2011 | Cao | H01S 5/0683 |
| | | | 372/29.021 |
| 9,882,350 B2* | 1/2018 | Zhang | H01S 5/06804 |
| 2003/0142718 A1 | 7/2003 | Hayakawa | |
| 2005/0147139 A1* | 7/2005 | Saedi | H01S 5/02415 |
| | | | 372/34 |
| 2006/0227824 A1* | 10/2006 | Dyer | H01S 5/0607 |
| | | | 372/29.011 |
| 2013/0208745 A1* | 8/2013 | Sjolund | H01S 5/02248 |
| | | | 372/34 |

* cited by examiner

OPTICAL MODULE

CROSS-REFERENCE TO RELATED APPLICATION

This application is a continuation under 35 U.S.C. § 120 of U.S. application Ser. No. 14/886,906, filed Oct. 19, 2015, which claims the benefit under 35 U.S.C. § 119(a) to the filing date of Chinese Patent Application No. 201510133857.5, filed on Mar. 25, 2015, which is hereby incorporated by reference in its entirety.

TECHNICAL FIELD

The present disclosure relates to the field of optical fiber communications technologies, and in particular, to an optical module.

BACKGROUND

Currently, an Ethernet passive optical network (EPON) optical line terminal (OLT) optical module is generally a multi-channel sending and receiving optical component integrating an emitting channel and a receiving channel.

FIG. 1 exemplary shows a schematic structural diagram of an asymmetrical mode 10G EPON OLT. The schematic structural diagram includes a single optical fiber 10, a coaxial packaging distributed feedback laser (DFB) 11, a first filter 12, a coaxial packaging optical receiving component 13, a second filter 14, an external lens 15, an electro-absorption modulated laser (EML) 16, and a horizontal axis 17. The EML 16 is configured to emit a first downlink optical signal $\lambda 1$, which is a 10 Gb/s convergent light, and the wavelength thereof is 1577±3 nm. The single fiber 10 and the EML 16 are disposed oppositely along the horizontal axis 17, which are configured to transmit at least one pair of uplink and downlink optical signals bidirectionally. The first filer 12 and the second filter 14 are located on the horizontal axis 17. The second filter 14 adjacent to the EML 16 is approximately 136° degree from the horizontal axis 17, and the first filter 12 adjacent to the fiber 10 is approximately 45° degree from the horizontal axis 17. The first downlink optical signal $\lambda 1$ transmits through the second filter 14 and the first filter 12 in sequence and then converges to the fiber 10 for outputting. The coaxial packaging DFB 11 on one side of the horizontal axis 17 is configured to emit a second downlink optical signal $\lambda 2$, which is a 1.25 Gb/s convergent light, and the wavelength thereof is 1490±20 nm. The optical signal is reflected to the first filter 12 after incoming to the second filter 14 converges to the fiber 10 for outputting after transmitting through the first filer 12. The single fiber 10 inputs a 1.25 Gb/s first uplink optical signal $\lambda 3$, which has a wavelength of 1310±50 nm. After outgoing from the fiber 10, the first uplink optical signal $\lambda 3$ incomes to the first filter 12, and reflected by the first filter 12, and then incomes to the coaxial packaging optical receiving component 13 on another side of the horizontal axis 17 for receiving.

SUMMARY

In a first aspect of the disclosure, an optical module includes: a first thermoelectric cooler (TEC), configured to perform heating or cooling according to an enabling signal input by a micro control unit (MCU), where the first TEC is disposed at least partially inside a laser; a second TEC, configured to perform heating or cooling according to an enabling signal input by the MCU, where the second TEC is disposed on a housing of the laser. The MCU is configured to determine whether to input an enabling signal or a disabling signal to the first TEC and the second TEC according to a size of operating current input by a drive circuit of a laser chip to the laser chip.

In a second aspect of the disclosure, a system includes: a laser disposed at least partially in a housing and configured to communicate with an optical network; a first thermoelectric cooler (TEC) disposed at least partially inside the laser, configured to perform heating or cooling according to an enabling signal input by a micro control unit (MCU). The system also includes a second TEC disposed outside of the housing, configured to perform heating or cooling according to an enabling signal input by the MCU. The MCU is configured to determine to input an enabling signal or a disabling signal to the first TEC and the second TEC according to a size of operating current input by a drive circuit of a laser chip to the laser chip.

BRIEF DESCRIPTION OF THE DRAWINGS

To illustrate the technical solutions in the embodiments of the present disclosure more clearly, the following briefly introduces the accompanying drawings required for describing the embodiments or the existing technology. Apparently, the accompanying drawings in the following description show merely some embodiments of the present disclosure, and a person of ordinary skill in the art may still derive other drawings from these accompanying drawings without creative efforts.

DETAILED DESCRIPTION OF THE DRAWINGS

Figure 1:
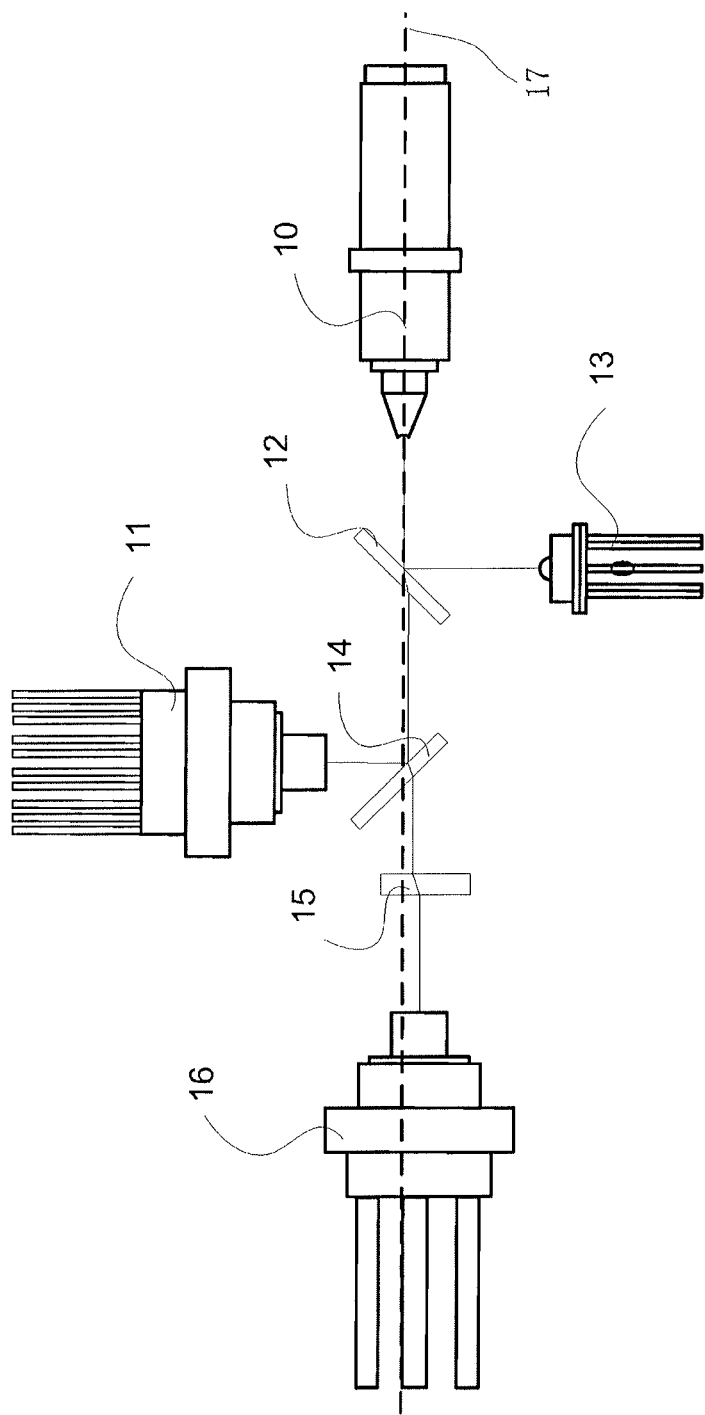
FIG. 1 is a schematic structural diagram of an asymmetrical mode 10G EPON OLT in the existing technology.

Throughout the specification and claims, terms may have nuanced meanings suggested or implied in context beyond an explicitly stated meaning. Likewise, the phrase "in one embodiment" as used herein does not necessarily refer to the same embodiment and the phrase "in another embodiment" as used herein does not necessarily refer to a different embodiment. It is intended, for example, that claimed subject matter include combinations of example embodiments in whole or in part.

In general, terminology may be understood at least in part from usage in context. For example, terms, such as "and", "or", or "and/or," as used herein may include a variety of meanings that may depend at least in part upon the context in which such terms are used. Typically, "or" if used to associate a list, such as A, B or C, is intended to mean A, B, and C, here used in the inclusive sense, as well as A, B or C, here used in the exclusive sense. In addition, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

Various units, circuits, or other components may be described or claimed as "configured to" perform a task or tasks. In such contexts, "configured to" is used to connote structure by indicating that the units/circuits/components include structure (e.g., circuitry) that performs those task or tasks during operation. As such, the unit/circuit/component can be said to be configured to perform the task even when the specified unit/circuit/component is not currently operational (e.g., is not on). The units/circuits/components used with the "configured to" language include hardware—for example, circuits, memory storing program instructions executable to implement the operation, etc. Reciting that a unit/circuit/component is "configured to" perform one or more tasks is expressly intended not to invoke 35 U.S.C. section 112, sixth paragraph, for that unit/circuit/component. Additionally, "configured to" can include generic structure (e.g., generic circuitry) that is manipulated by software and/or firmware (e.g., an FPGA or a general-purpose processor executing software) to operate in manner that is capable of performing the task(s) at issue.

The following clearly and completely describes the technical solutions in the embodiments of the present disclosure with reference to the accompanying drawings in the embodiments of the present disclosure. Apparently, the described embodiments are some of the embodiments of the present disclosure rather than all of the embodiments. All other embodiments obtained by a person of ordinary skill in the art based on the embodiments of the present disclosure without creative efforts shall fall within the protection scope of the present disclosure.

In the description of the present disclosure, it should be understand that positions and positional relationships indicated by the terms such as "center", "above", "below", "in front of", "behind", "left", "right", "vertical", "horizontal", "top", "bottom", "inside", "outside" are based on the position or positional relationship shown in the accompany drawings, which are used only for convenient and brief description, and do not indicate or imply that the indicated apparatus or element must be in a specific position, and must be constructed and operated in a specific position. In addition, in embodiments of the present disclosure, an inner end and an outer end are both defined according to directions of signals in a transmission path, that is, according to directions of signals in a transmission path, one end for inputting signals is defined as the outer end or a signal input end of the transmission path, and another end for outputting signals is defined as the inner end or a signal output end. Of course, other names may be defined according to principles, and thus the foregoing cannot be understood as a limitation on the present disclosure.

To make the objectives, technical solutions, and advantages of the present disclosure clearer, the following further describes the present disclosure in detail with reference to the accompanying drawings. Apparently, the described embodiments are merely some but not all of the embodiments of the present disclosure. All other embodiments obtained by a person of ordinary skill in the art based on the embodiments of the present disclosure without creative efforts shall fall within the protection scope of the present disclosure.

An embodiment of the present disclosure provides an optical module, which may solve a problem that an operating temperature of the optical module cannot meet an industrial-grade operating temperature range in the existing technology.

Figure 2:
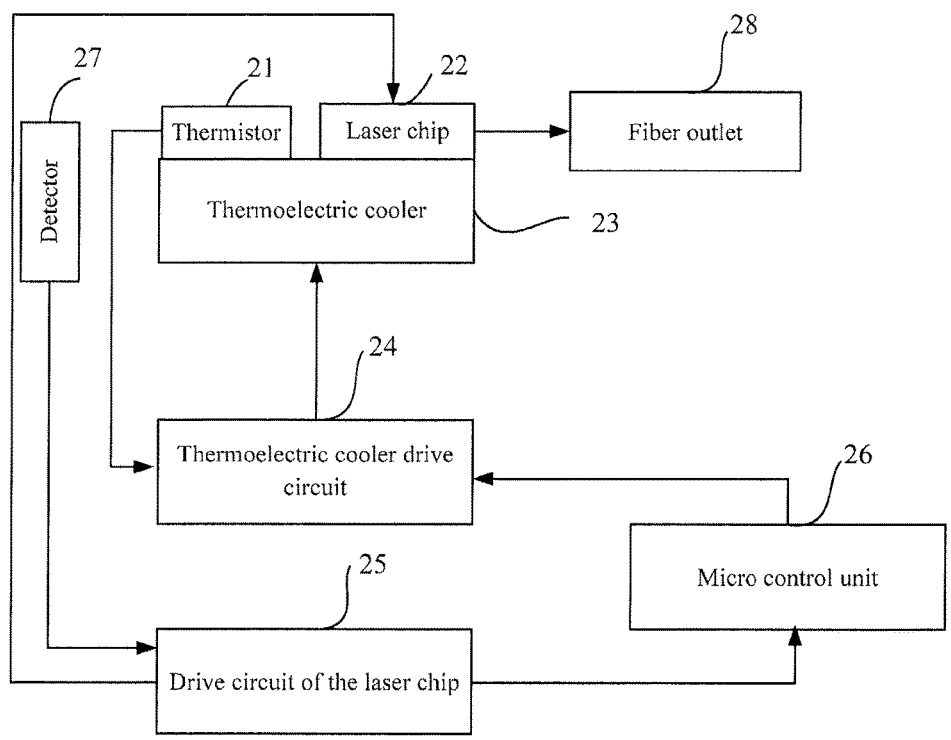
FIG. 2 is a schematic structural diagram of an optical module part of an EML in the existing technology.

FIG. 2 exemplary shows a partial schematic circuit diagram including an EML of an optical module. As shown in FIG. 2, the EML and drive circuit includes a thermistor 21, a laser chip 22, a thermoelectric cooler (TEC) 23, a TEC drive circuit 24, a drive circuit 25 of the laser chip, a micro control unit (MCU) 26, a detector 27, and a fiber outlet 28. The TEC drive circuit 24 is configured to keep a constant temperature inside the laser, that is, keep a constant operating temperature of the laser chip 22. The detector 27 is configured to monitor a backlight source during laser operation, and feed back the backlight source during the laser operation to the drive circuit 25 of the laser chip. The drive circuit 25 of the laser chip determines, according to information fed back by the detector 27, size of operating current provided to the laser chip. In addition, the MCU 26 determines, according to the size of the operating current provided by the drive circuit of the laser chip to the laser chip, whether to enable the TEC. The thermistor 21 and the laser chip 22 are attached on the TEC 23. The thermistor 21 collects operating temperatures of the laser chip 22 at any time, and feeds back the collected operating temperatures of the laser chip 22 to the TEC drive circuit 24. After the TEC drive circuit 24 receives a signal indicating enabling the TEC sent by the MCU 26, the TEC drive circuit 24 determines, according to the operating temperatures of the laser chip 22 fed back by the thermistor 21, to input heating or cooling current to the TEC 23, thereby keeping the constant operating temperature of the laser chip 22.

However, in a high temperature environment with a temperature higher than 70 degree Celsius or a low temperature environment with a temperature lower than −5 degree Celsius, if the foregoing heating or cooling method is used to keep the constant operating temperature of the optical module, large current needs to be consumed.

Table 1 shows maximum current size limits consumed for the optical module under different temperatures.

| Temperature range | Maximum current size |
| --- | --- |
| −5~+70 (commercial grade) | <450 mA |
| −40~+85 (industrial grade) | >570 mA |

When the forgoing method for keeping the constant operating temperature of the laser in the optical module is used in a wider temperature range, for example, when the laser is operating under a temperature within an industrial-grade temperature range (−40 degree Celsius to +85 degree Celsius), in a high temperature environment with a temperature higher than 70 degree Celsius or a low temperature environment with a temperature lower than −5 degree Celsius, the operating current of the TEC used to heat or cool the laser exceeds a limit of a functional circuit of the TEC inside the optical module, which may cause the TEC circuit invalid and the operating temperature of the laser is not kept to a target temperature constantly. Therefore, the optical module operation is failure and even the optical module is damaged.

Figure 3:
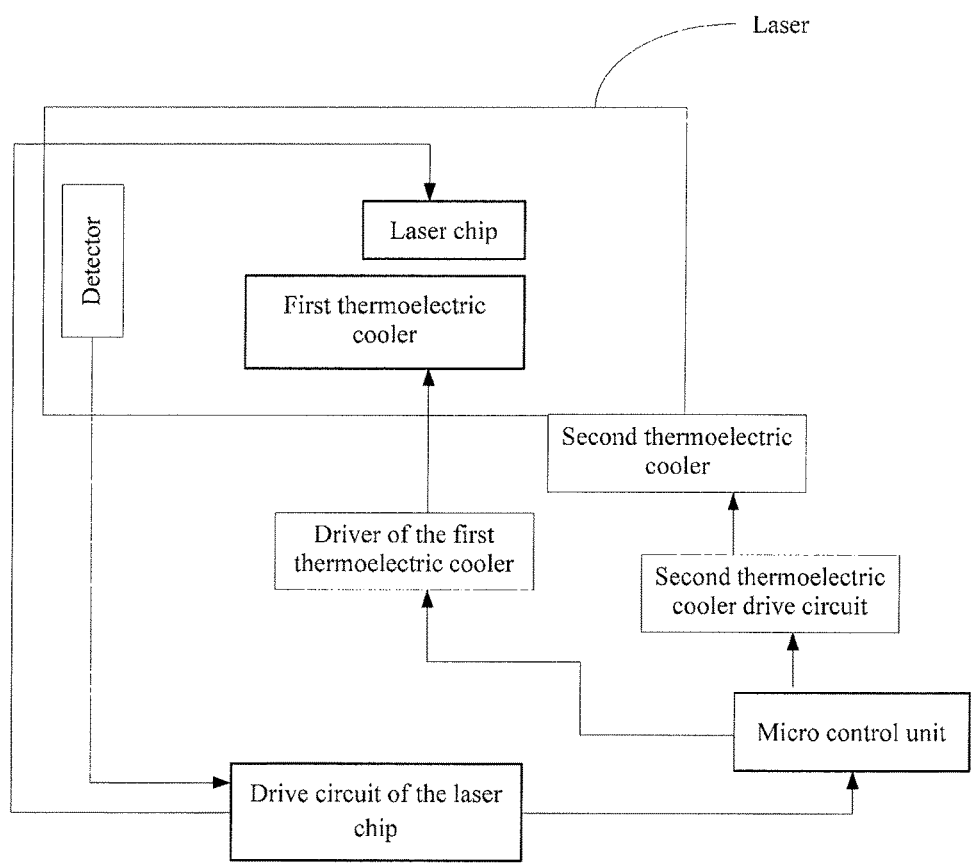
FIG. 3 is a schematic structural diagram of an optical module according to Embodiment 1 of the present disclosure.

FIG. 3 exemplary shows an optical module according to Embodiment 1 of the present disclosure, which includes: a first TEC, configured to perform heating or cooling according to an enabling signal input by a MCU, where the first TEC is disposed inside a laser; a second TEC, configured to perform heating or cooling according to the enabling signal input by the MCU, where the second TEC is disposed on a housing of the laser; and the MCU, configured to determine, according to size of operating current input by a drive circuit of a laser chip to the laser chip, to input an enabling signal or a disabling signal to the first TEC and the second TEC. For example, the second TEC may be disposed on an outside surface of the housing of the laser.

Alternatively or additionally, the first TEC may fit the laser chip, and a hole is disposed on a temperature controlling plane of the first TEC, where the hole may accommodate a conductive wire of the laser chip passing through the first TEC, so that a surface having the conductive wire of the laser chip fits the temperature controlling plane of the first TEC. The conductive wire may be a gold wire. The first TEC may implement an electric heating or cooling function. In addition, the heating or cooling of the first TEC may be automatically set according to a temperature range set by the optical module and an operating temperature inside the laser.

Alternatively or additionally, multiple holes may be disposed on the temperature controlling plane of the first TEC, and the multiple holes may one-to-one correspond to multiple pins of the laser chip.

Alternatively or additionally, a hole is disposed on a temperature controlling plane of the second TEC, where the hole may accommodate a pin of the laser passing through the second TEC, so that a surface having the pin of the laser fits the temperature controlling plane of the second TEC. The second TEC may implement an electric heating or cooling function. In addition, the heating or cooling of the second TEC may be automatically set according to a temperature range set by the optical module.

Further, multiple holes may be disposed on the temperature controlling plane of the second TEC, and the multiple holes may one-to-one correspond to multiple pins of the laser.

The MCU communicates with the drive circuit of the laser chip mainly through an inter-integrated circuit (I2C) bus or a serial peripheral interface (SPI), and determines, according to the size of the operating current input by the drive circuit of the laser chip to the laser chip, whether to enable the first TEC, or to enable the first TEC and the second TEC, or to enable the first TEC on the basis that the first TEC is enabled.

Further, a temperature detector is disposed on the first TEC inside the laser (not shown in FIG. 3). The temperature detector is configured to monitor an operating temperature of the laser chip, and feed back the detected operating temperature of the laser chip to the drive circuit of the laser.

Further, a backlight detector is disposed inside the laser, which is configured to detect back current of the laser. The backlight detector feeds back the detected back current of the laser to the drive circuit of the laser chip.

The drive circuit of the laser chip determines the size of the operating current input to the laser chip according to parameters such as the operating temperature, the back current, and power of the laser reported based on sampling.

Further, a first TEC drive circuit is further included. The first TEC drive circuit is configured to enable or disable the first TEC according to the enabling or disabling signal input by the MCU. The MCU determines a size of heating or cooling current input by the first TEC drive circuit to the first TEC according to the size of the operating current input by the drive circuit of the laser chip to the laser chip.

Further, a second TEC drive circuit is further included. The second TEC drive circuit is configured to enable or disable the second TEC according to the enabling or disabling signal input by the MCU. The MCU determines a size of heating or cooling current input by the second TEC drive circuit to the second TEC according to the size of the operating current input by the drive circuit of the laser chip to the laser chip.

Further, there are multiple second TECs. Two or more second TECs are disposed on a same plane and gaps that can accommodate pins of the laser are left, and the pins of the laser are passed though the left gaps, so that the surface having the pins of the laser fits the temperature controlling plane of the two or more TECs.

Further, the two or more second TECs may be connected or not connected, or may connect to the second TEC drive circuit respectively, or may connect to a second TEC drive circuit each, which is not limited in the embodiment of the present disclosure.

A part of the optical module in the foregoing embodiment encapsulates the laser. The operating temperature of the laser may include a temperature of an environment where the laser is located and a temperature of the housing of the laser. The temperature of the environment where the laser is located is 5° to 10° lower than the temperature of the housing of the laser, and the temperature of the housing of the laser is 5° to 10° lower than the temperature of the laser chip. The embodiment of the present disclosure does not limit the operating temperature of the laser.

A specific operating process of the foregoing optical module is: when the operating temperature of the laser chip in the optical module is set within a range of 40° to 45° and a temperature range that can be controlled by the first TEC is −10° to 80°, if the drive circuit of the laser chip determines that the operating current needs to be input to the laser chip is changed according to the back current of the laser reported by the backlight detector or parameters such as the operating temperature of the laser, and the like; the MCU compares the size of the operating current input by the drive circuit of the laser chip to the laser chip with a first current range stored in the MCU, and if the size of the operating current input by the drive circuit of the laser chip to the laser chip exceeds the first current range stored in the MCU, the MCU needs to input the enabling signal to the first TEC drive circuit, and then the first TEC drive circuit inputs the enabling signal to the first TEC; in addition, the first TEC drive circuit input the MCU-determined heating or cooling current to the first TEC at the same time when the first TEC is enabled according to the MCU-determined size of the heating or cooling current input to the first TEC.

Further, the MCU compares the size of the operating current input by the drive circuit of the laser chip to the laser chip with current ranges stored in the MCU, if the size of the operating current input by the drive circuit of the laser chip to the laser chip exceeds the first current range stored in the MCU and exceeds a second current range stored in the MCU, that is, the operating temperature of the laser exceeds an operating temperature range of the laser chip and exceeds the temperature range that can be controlled by the first TEC. If the MCU determines that the first TEC is in operate state, the MCU determines to input the enabling signal to the second TEC drive circuit, and then the second drive circuit inputs the enabling signal to the second TEC, and the second TEC drive circuit determines, according to the MCU-determined size of the heating or cooling current input to the second TEC, to input the MCU-determined heating or cooling current to the second TEC at the same time when the second TEC is enabled; if the MCU determines that the first TEC is in closed state, the MCU determines to input the enabling signal to the first TEC drive circuit and the second TEC drive circuit, and input the MCU-determined heating or cooling current to the first TEC drive circuit and the second TEC drive circuit.

In Embodiment 1 of the present disclosure, the MCU compares the size of the operating current input by the drive circuit of the laser chip to the laser chip with two current ranges stored in the MCU, where the first current range stored in the MCU corresponds to enabling or disabling the first TEC, and the second current range corresponds to enabling or disabling the second TEC. If the size of the operating current input by the drive circuit of the laser chip to the laser chip is within the first current range stored in the MCU, the MCU determines that the first TEC needs to be enabled; if the size of the operating current input by the drive circuit of the laser chip to the laser chip falls below the first current range stored in the MCU, the MCU determines that the disabling signal needs to be sent to the first TEC; if the size of the operating current input by the drive circuit of the laser chip to the laser chip is within the second current range stored in the MCU, the MCU determines that the second TEC needs to be enabled; and if the size of the operating current input by the drive circuit of the laser chip to the laser chip is within the first current range stored in the MCU, the MCU determines that the disabling signal needs to be sent to the second TEC.

Figure 4:
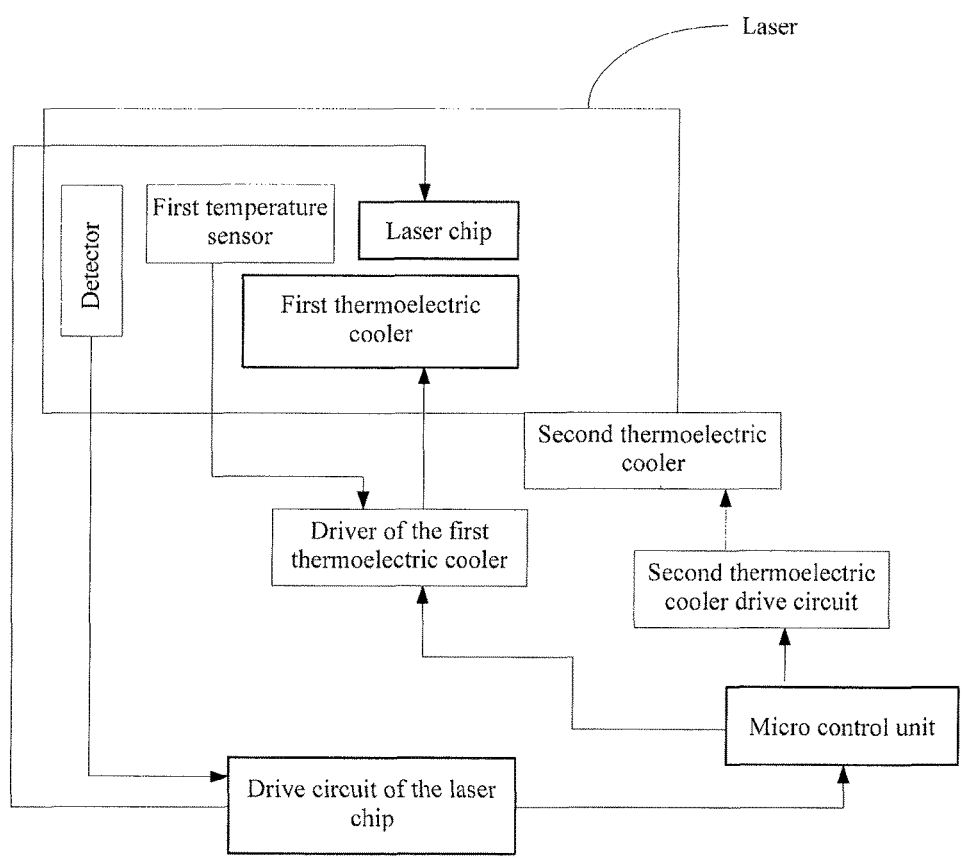
FIG. 4 is a schematic structural diagram of an optical module according to Embodiment 2 of the present disclosure.

FIG. 4 shows an optical module according to Embodiment 2 of the present disclosure.

The optical module according to Embodiment 2 of the present disclosure is based on the optical module according to Embodiment 1, which further includes a first temperature sensor. The first temperature sensor is disposed on the first TEC, and the first temperature sensor and the laser chip are disposed side by side. The first temperature sensor is configured to monitor the operating temperature of the laser, and send the operating temperature of the laser to the first TEC drive circuit.

Further, the first TEC drive circuit compares a temperature fed back by the first temperature sensor with a first temperature range stored in the first TEC drive circuit, and if the temperature fed back by the first temperature sensor exceeds the first temperature range stored in the first TEC drive circuit, the first TEC drive circuit determines the size of the heating or cooling current output for the first TEC.

In the embodiment of the present disclosure, because the first TEC drive circuit, the first TEC, and the first temperature sensor constitute a closed loop operating state, the first TEC drive circuit enables or disables the first TEC according to the enabling or disabling signal sent by the MCU. However, when enabling the first TEC, the first TEC drive circuit compares the operating temperature of the laser fed back by the first temperature sensor with the first temperature range stored in the first TEC to determine the size of the heating or cooling current that needs to be input for the first TEC.

Further, there may be one or more second TECs.

If there is one second TEC, the second TEC is disposed on the housing of the laser and is connected to the second TEC drive circuit. The second TEC drive circuit enables or disables the second TEC according to the enabling or disabling signal input by the MCU, and at the same time when the second TEC is enabled, the second TEC drive circuit inputs a corresponding heating or cooling current to the second TEC according to the MCU-determined size of the heating or cooling current input to the second TEC.

If there are multiple second TECs, two or more second TECs are disposed on a same plane and gaps that can accommodate pins of the laser are left, and the pins of the laser are passed though the left gaps, so that the surface having the pins of the laser fits the temperature controlling plane of the two or more TECs.

Further, the two or more second TECs may be connected or not connected, or may connect to the second TEC drive circuit respectively, or may connect to a second TEC drive circuit each, which is not limited in the embodiment of the present disclosure.

A specific operating process of the optical module in the forgoing embodiment is: when the operating temperature of the laser chip in the optical module is set within a range of 40° to 45°, and the temperature range that can be controlled by the first TEC is −10° to 80°, if the drive circuit of the laser chip determines that the operating current needs to be input to the laser chip is changed according to the back current of the laser reported by the backlight detector or parameters such as the operating temperature of the laser, and the like; the MCU compares the size of the operating current input by the drive circuit of the laser chip to the laser chip with the first current range stored in the MCU, and if the size of the operating current input by the drive circuit of the laser chip to the laser chip exceeds the first current range stored in the MCU, the MCU needs to input the enabling signal to the first TEC drive circuit, and the first TEC drive circuit determines the size of the heating or cooling current input to the first TEC according to the operating temperature of the laser fed back by the first temperature sensor, and at the same time when the first TEC is enabled, the first TEC drive circuit inputs the heating or cooling current determined by the first TEC driver circuit to the first TEC.

Further, the MCU compares the size of the operating current input by the drive circuit of the laser chip to the laser chip with current ranges stored in the MCU, if the size of the operating current input by the drive circuit of the laser chip to the laser chip exceeds the first current range stored in the MCU and exceeds the second current range stored in the MCU, that is, the operating temperature of the laser exceeds the operating temperature range of the laser chip and exceeds the temperature range that can be controlled by the first TEC. If the MCU determines that the first TEC is in operate state, the MCU determines to input the enabling signal to the second TEC drive circuit, and then the second drive circuit inputs the enabling signal to the second TEC, and the second TEC drive circuit determines, according to the MCU-determined size of the heating or cooling current input to the second TEC, to input the MCU-determined heating or cooling current to the second TEC at the same time when the second TEC is enabled; if the MCU determines that the first TEC is in closed state, the MCU determines to input the enabling signal to the first TEC drive circuit and the second TEC drive circuit, and the first TEC drive circuit determines the size of the heating or cooling current input to the first TEC according to the operating temperature of the laser fed back by the first temperature sensor, and at the same time when the first TEC is enabled, the first TEC drive circuit inputs the heating or cooling current determined by the first TEC drive circuit; and the second TEC drive circuit inputs the enabling signal and the heating or cooling current to the second TEC according to the enabling signal and the size of the heating or cooling current input by the MCU.

In Embodiment 2 of the present disclosure, the MCU compares the size of the operating current input by the drive circuit of the laser chip to the laser chip with two current ranges stored in the MCU, where the first current range stored in the MCU corresponds to enabling or disabling the first TEC, and the second current range corresponds to enabling or disabling the second TEC. If the size of the operating current input by the drive circuit of the laser chip to the laser chip is within the first current range stored in the MCU, the MCU determines that the first TEC needs to be enabled; if the size of the operating current input by the drive circuit of the laser chip to the laser chip falls below the first current range stored in the MCU, the MCU determines that the disabling signal needs to be sent to the first TEC; if the size of the operating current input by the drive circuit of the laser chip to the laser chip is within the second current range stored in the MCU, the MCU determines that the second TEC needs to be enabled; and if the size of the operating current input by the drive circuit of the laser chip to the laser chip is within the first current range stored in the MCU, the MCU determines that the disabling signal needs to be sent to the second TEC.

Figure 5:
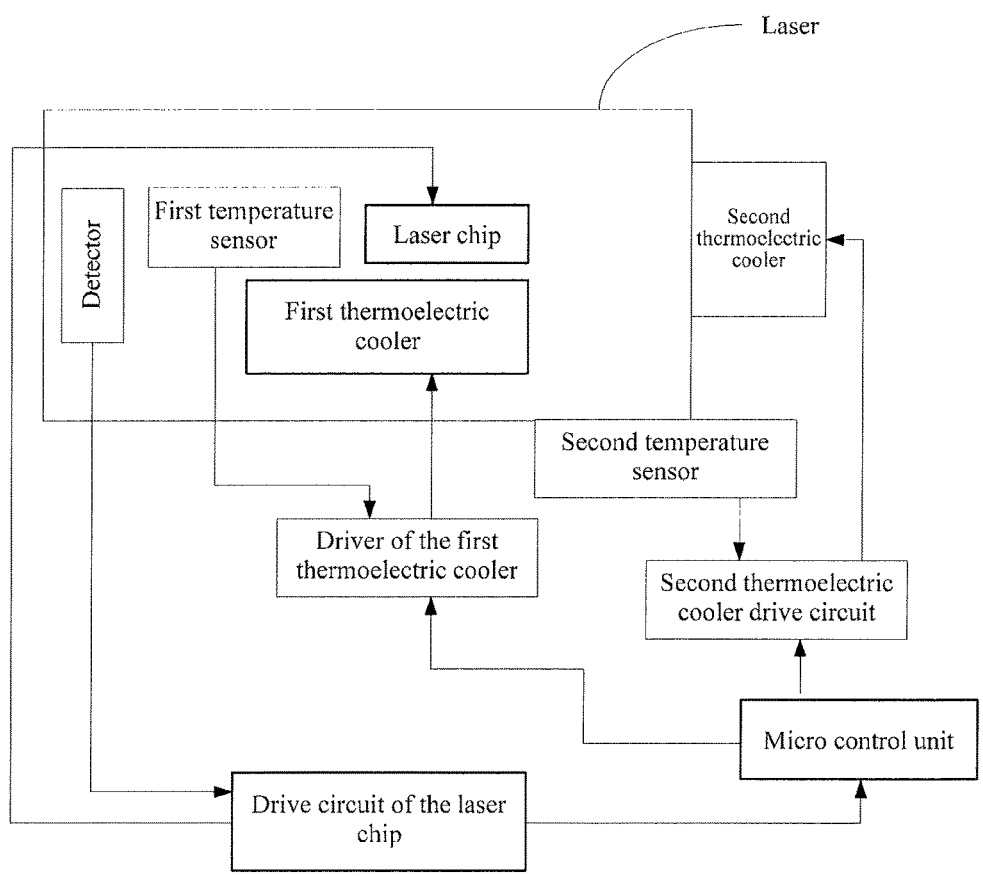
FIG. 5 is a schematic structural diagram of an optical module according to Embodiment 3 of the present disclosure.

FIG. 5 shows an optical module according to Embodiment 3 of the present disclosure.

The optical module according to Embodiment 3 of the present disclosure is based on the optical module according to Embodiment 2, which further includes a second temperature sensor. The second temperature sensor is disposed on the housing of the laser and is connected to the second TEC drive circuit. The second temperature sensor is configured to monitor the operating temperature of the housing of the laser.

Further, the second TEC drive circuit compares a temperature fed back by the second temperature sensor with a second temperature range stored in the second TEC drive circuit, and if the temperature fed back by the second temperature sensor exceeds the second temperature range stored in the second TEC drive circuit, the second TEC drive circuit determines the size of the heating or cooling current output for the second TEC.

In the embodiment of the present disclosure, because the second TEC drive circuit, the second TEC, and the second temperature sensor constitute a closed loop operating state, the second TEC drive circuit enables or disables the second TEC according to the enabling or disabling signal sent by the MCU. However, when enabling the second TEC, the second TEC drive circuit compares the operating temperature of the laser fed back by the second temperature sensor with the second temperature range stored in the second TEC to determine the size of the heating or cooling current that needs to be input for the second TEC.

Further, there may be one or more second TECs.

If there is one second TEC, the second TEC is disposed on the housing of the laser and is connected to the second TEC drive circuit. The second TEC drive circuit enables or disables the second TEC according to the enabling or disabling signal input by the MCU, and at the same time when the second TEC is enabled, the second TEC drive circuit inputs a corresponding heating or cooling current to the second TEC according to the MCU-determined size of the heating or cooling current input to the second TEC.

If there are multiple second TECs, two or more second TECs are disposed on a same plane and gaps that can accommodate pins of the laser are left, and the pins of the laser are passed though the left gaps, so that the surface having the pins of the laser fits the temperature controlling plane of the two or more TECs.

Further, the two or more second TECs may be connected or not connected, or may connect to the second TEC drive circuit respectively, or may connect to a second TEC drive circuit each, which is not limited in the embodiment of the present disclosure.

A specific operating process of the optical module in the foregoing embodiment is: when the operating temperature of the laser chip in the optical module is set within a range of 40° to 45°, and the temperature range that can be controlled by the first TEC is −10° to 80°, if the drive circuit of the laser chip determines that the operating current needs to be input to the laser chip is changed according to the laser back current reported by the backlight detector or parameters such as the operating temperature of the laser and the like; the MCU compares the size of the operating current input by the laser chip drive to the laser chip with the first current range stored in the MCU, and if the size of the operating current input by the drive circuit of the laser chip to the laser chip exceeds the first current range stored in the MCU, the MCU needs to input the enabling signal to the first TEC drive circuit, and the first TEC drive circuit determines the size of the heating or cooling current input to the first TEC according to the operating temperature of the laser fed back by the first temperature sensor, and at the same time when the first TEC is enabled, the first TEC drive circuit inputs the heating or cooling current determined by the first TEC drive circuit to the first TEC.

Further, the MCU compares the size of the operating current input by the drive circuit of the laser chip to the laser chip with current ranges stored in the MCU, if the size of the operating current input by the drive circuit of the laser chip to the laser chip exceeds the first current range stored in the MCU and exceeds the second current range stored in the MCU, that is, the operating temperature of the laser exceeds the operating temperature range of the laser chip and exceeds the temperature range that can be controlled by the first TEC. If the MCU determine that the first TEC is in operate state, the MCU determines to input the enabling signal to the second TEC drive circuit, and the second TEC drive circuit determines the size of the heating or cooling current input to the second TEC according to the operating temperature of the housing of the laser fed back by the second temperature sensor and input the heating or cooling current determined by the second TEC drive circuit to the second TEC at the same time when the second TEC is enabled; and if the MCU determines that the first TEC is in closed state, the MCU determines to input the enabling signal to the first TEC drive circuit and the second TEC drive circuit, and the first TEC drive circuit determines the size of the heating or cooling current input to the first TEC according to the operating temperature of the laser fed back by the first temperature sensor and input the heating or cooling current determined by the first TEC drive circuit to the first TEC at the same time when the first TEC is enabled; and the second TEC drive circuit determines the size of the heating or cooling current input to the second TEC according to the operating temperature of the housing of the laser fed back by the second temperature sensor and input the heating or cooling current determined by the second TEC drive circuit to the second TEC at the same time when the second TEC is enabled.

In Embodiment 3 of the present disclosure, the MCU compares the size of the operating current input by the drive circuit of the laser chip to the laser chip with two current ranges stored in the MCU, where the first current range stored in the MCU corresponds to enabling or disabling the first TEC, and the second current range corresponds to enabling or disabling the second TEC. If the size of the operating current input by the drive circuit of the laser chip to the laser chip is within the first current range stored in the MCU, the MCU determines that the first TEC needs to be enabled; if the size of the operating current input by the drive circuit of the laser chip to the laser chip falls below the first current range stored in the MCU, the MCU determines that the disabling signal needs to be sent to the first TEC; if the size of the operating current input by the drive circuit of the laser chip to the laser chip is within the second current range stored in the MCU, the MCU determines that the second TEC needs to be enabled; and if the size of the operating current input by the drive circuit of the laser chip to the laser chip is within the first current range stored in the MCU, the MCU determines that the disabling signal needs to be sent to the second TEC.

Figure 6:
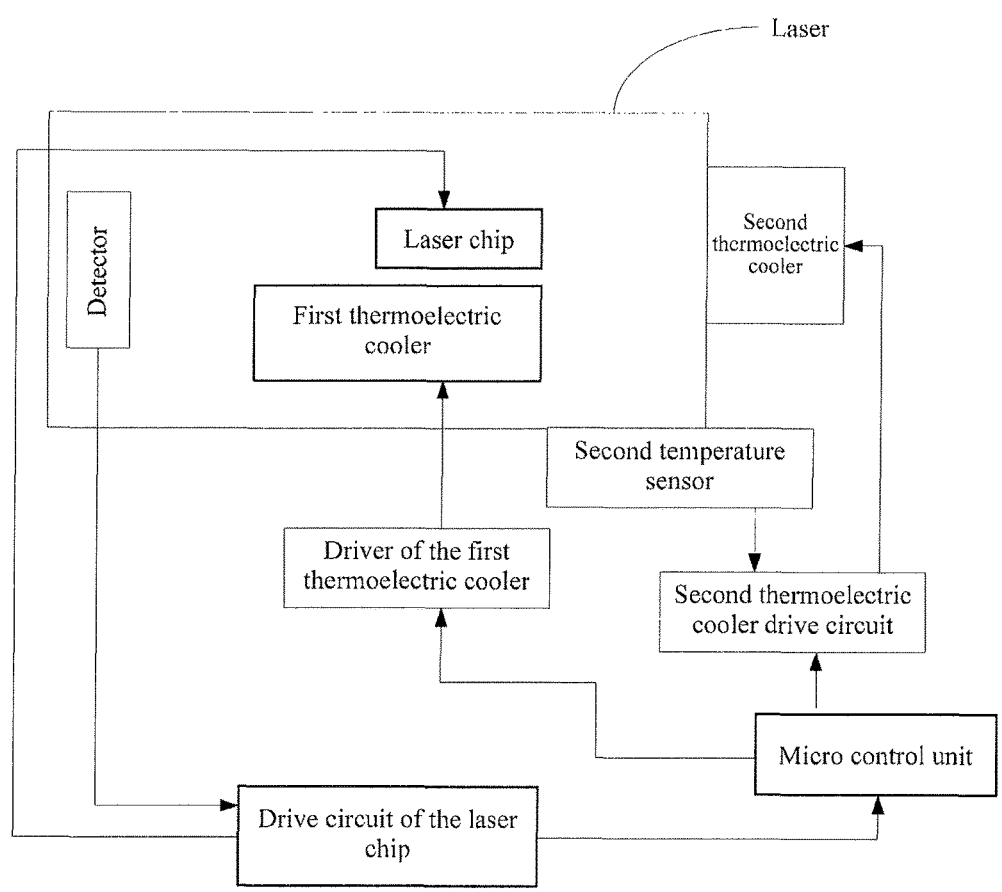
FIG. 6 is a schematic structural diagram of an optical module according to Embodiment 4 of the present disclosure.

FIG. 6 shows an optical module according to Embodiment 4 of the present disclosure.

The optical module according to Embodiment 4 of the present disclosure is based on the optical module according to Embodiment 1, which further includes a second temperature sensor. The second temperature sensor is disposed on the housing of the laser and is connected to the second TEC drive circuit. The second temperature sensor is configured to monitor the operating temperature of the housing of the laser.

Further, the second TEC drive circuit compares a temperature fed back by the second temperature sensor with a second temperature range stored in the second TEC drive circuit, and if the temperature fed back by the second temperature sensor exceeds the second temperature range stored in the second TEC drive circuit, the second TEC drive circuit determines the size of the heating or cooling current output for the second TEC.

In the embodiment of the present disclosure, because the second TEC drive circuit, the second TEC, and the second temperature sensor constitute a closed loop operating state, the second TEC drive circuit enables or disables the second TEC according to the enabling or disabling signal sent by the MCU. However, when enabling the second TEC, the second TEC drive circuit compares the operating temperature of the laser fed back by the second temperature sensor with the second temperature range stored in the second TEC to determine the size of the heating or cooling current that needs to be input for the second TEC.

Further, there may be one or more second TECs.

If there is one second TEC, the second TEC is disposed on the housing of the laser and is connected to the second TEC drive circuit. The second TEC drive circuit enables or disables the second TEC according to the enabling or disabling signal input by the MCU and at the same time when the second TEC is enabled, the second TEC drive circuit inputs a corresponding heating or cooling current to the second TEC according to the MCU-determined size of the heating or cooling current input to the second TEC.

If there are multiple second TECs, two or more second TECs are disposed on a same plane and gaps that can accommodate pins of the laser are left, and the pins of the laser are passed though the left gaps, so that the surface having the pins of the laser fits the temperature controlling plane of the two or more TECs.

Further, the two or more second TECs may be connected or not connected, or may connect to the second TEC drive circuit respectively, or may connect to a second TEC drive circuit each, which is not limited in the embodiment of the present disclosure.

An operating process of the optical module in the forgoing embodiment is: when the operating temperature of the laser chip in the optical module is set within a range of 40° to 45°, and the temperature range that can be controlled by the first TEC is −10° to 80°, if the drive circuit of the laser chip determines that the operating current needs to be input to the laser chip is changed according to the laser back current reported by the backlight detector or parameters such as the operating temperature of the laser and the like; the MCU compares the size of the operating current input by the drive circuit of the laser chip to the laser chip with the first current range stored in the MCU, and if the size of the operating current input by the drive circuit of the laser chip to the laser chip exceeds the first current range stored in the MCU, the MCU needs to input the enabling signal to the first TEC drive circuit, and the first TEC drive circuit inputs the enabling signal to the first TEC; in addition, the first TEC drive circuit inputs, according to the MCU-determined size of the cooling current input to the first TEC the heating or cooling current, the cooling current determined by the MCU to the first TEC at the same time when the first TEC is enabled.

Further, the MCU compares the size of the operating current input by the drive circuit of the laser chip to the laser chip with current ranges stored in the MCU, if the size of the operating current input by the drive circuit of the laser chip to the laser chip exceeds the first current range stored in the MCU and exceeds a second current range stored in the MCU, that is, the operating temperature of the laser exceeds the operating temperature range of the laser chip and exceeds the temperature range that can be controlled by the first TEC. If the MCU determines that the first TEC is in operate state, the MCU determines to input the enabling signal to the second TEC drive circuit, and the second TEC drive circuit determines the size of the heating or cooling current input to the second TEC according to the operating temperature of the housing of the laser fed back by the second temperature sensor and input the heating or cooling current determined by the second TEC drive circuit to the second TEC at the same time when the second TEC is enabled; and if the MCU determines that the first TEC is in closed state, the MCU determines to input the enabling signal to the first TEC drive circuit and the second TEC drive circuit, and the first TEC drive circuit inputs the heating or cooling current determined by the MCU to the first TEC at the same time when the first TEC is enabled according to the MCU-determined size of the heating or cooling current input to the first TEC; and the second TEC drive circuit determines the size of the heating or cooling current input to the second TEC according to the operating temperature of the housing of the laser fed back by the second temperature sensor and input the heating or cooling current determined by the second TEC drive circuit to the second TEC.

In Embodiment 4 of the present disclosure, the MCU compares the size of the operating current input by the drive circuit of the laser chip to the laser chip with two current ranges stored in the MCU, where the first current range stored in the MCU corresponds to enabling or disabling the first TEC, and the second current range corresponds to enabling or disabling the second TEC. If the size of the operating current input by the drive circuit of the laser chip to the laser chip is within the first current range stored in the MCU, the MCU determines that the first TEC needs to be enabled; if the size of the operating current input by the drive circuit of the laser chip to the laser chip falls below the first current range stored in the MCU, the MCU determines that the disabling signal needs to be sent to the first TEC; if the size of the operating current input by the drive circuit of the laser chip to the laser chip is within the second current range stored in the MCU, the MCU determines that the second TEC needs to be enabled; and if the size of the operating current input by the drive circuit of the laser chip to the laser chip is within the first current range stored in the MCU, the MCU determines that the disabling signal needs to be sent to the second TEC.

The optical module in the embodiment of the present disclosure includes: a TEC, configured to perform heating or cooling according to an enabling signal input by the MCU, where the first TEC is disposed inside a laser; a second TEC, configured to perform heating or cooling according to an enabling signal input by the MCU, where the second TEC is disposed on a housing of the laser; and the MCU, configured to determine, according to size of operating current input by a drive circuit of a laser chip to the laser chip, to input an enabling signal or a disabling signal to the first TEC and the second TEC.

In the foregoing embodiments, the first TEC is disposed at least partially inside the laser, and the second TEC is disposed on the housing of the laser. The first TEC and the second TEC may perform heating or cooling according to the enabling signal input by the MCU. The MCU controls operating status of the first TEC and the second TEC according to the size of the operating current input by the drive circuit of the laser chip to the laser chip, so that the optical module has a wider operating temperature range. Therefore, the optical module provided in the present disclosure may be used to solve the problem that the operating temperature of the optical module cannot meet the industrial-grade operating temperature range in the existing technology.

What is claimed is:

1. An optical module, comprising:
a first thermoelectric cooler (TEC) disposed at least partially inside a laser housing configured to perform heating or cooling when enabled; and
a second thermoelectric (TEC) disposed on the laser housing configured to perform heating or cooling when enabled,
wherein
when an operating current flowing into a drive circuit of a laser chip disposed within the laser housing is within a first current range, the first TEC is enabled; and
when the operating current flowing into the drive circuit of the laser chip is within a second current range, the second TEC is enabled.

2. The optical module according to claim 1, wherein an amount of current flowing into the first TEC is based on an operating temperature of the laser chip.

3. The optical module according to claim 2, further comprising:
a first temperature sensor disposed on the laser chip configured to monitor an operating temperature of the laser chip, wherein the amount of current flowing into the first TEC is determined after the first temperature sensor indicates that the operating temperature of the laser chip exceeds a first temperature range.

4. The optical module according to claim 1, further comprising a first temperature sensor disposed on the laser chip configured to monitor an operating temperature of the laser chip, wherein the amount of current flowing into the first TEC is determined after the first temperature sensor indicates that the operating temperature of the laser chip exceeds a first temperature range.

5. The optical module according to claim 1, wherein the first TEC is enabled when the operating current input to the laser chip exceeds a first current range.

6. The optical module according to claim 1, comprising multiple second TECs disposed on the housing of the laser chip separately wherein the multiple second TECs are configured to perform heating or cooling of the housing of the optical module based on current flowing into the multiple second TECs.

7. The optical module according to claim 1, further comprising a second temperature sensor disposed on the housing of the laser chip configured to monitor an operating temperature of the housing of the laser chip,
wherein the amount of current flowing into the second TEC is determined after the second temperature sensor indicates that the operating temperature of the housing of the laser chip exceeds a second temperature range.

8. The optical module according to claim 1, wherein a range of current over which the first TEC drive circuit is activated is different than a range of current over which the second TEC drive circuit is activated.

9. A system, comprising:
a laser chip disposed at least partially in a housing and configured to communicate with an optical network;
a first thermoelectric cooler (TEC) disposed at least partially inside the laser housing configured to perform heating or cooling when enabled; and
a second thermoelectric (TEC) disposed on the laser housing configured to perform heating or cooling when enabled,
wherein
when an operating current flowing into a drive circuit of the laser chip is within a first current range, the first TEC is enabled; and
when the operating current flowing into the drive circuit of the laser chip is within a second current range, the second TEC is enabled.

10. The system according to claim 9, wherein an amount of current flowing into the first TEC is based on an operating temperature of the laser chip.

11. The system according to claim 10, further comprising:
a first temperature sensor disposed on the laser chip configured to monitor an operating temperature of the laser chip, wherein the amount of current flowing into the first TEC is determined after the first temperature sensor indicates that the operating temperature of the laser chip exceeds a first temperature range.

12. The system according to claim 9, further comprising:
a backlight detector connected to an input end of the drive circuit of the laser chip that is configured to monitor back current of the laser chip,
wherein the drive circuit of the laser chip determines the amount of the operating current input to the laser chip based on the back current of the back current of the laser chip.

13. The system according to claim 9, further comprising:
a first temperature sensor disposed on the laser chip configured to monitor an operating temperature of the laser chip, wherein the amount of current flowing into the first TEC is determined after the first temperature sensor indicates that the operating temperature of the laser chip exceeds a first temperature range.

14. The system according to claim 9, wherein the first TEC is enabled when the operating current input to the laser chip exceeds a first current range.

15. The system according to claim 9, comprising multiple second TECs disposed on the housing of the laser chip separately, wherein the multiple second TECs are configured to perform heating or cooling for the housing of the optical module based on current flowing into the multiple second TECs.

16. The system module according to claim 9, further comprising a second temperature sensor disposed on the housing of the laser chip configured to monitor an operating temperature of the housing of the laser chip,
  wherein the amount of current flowing into the second TEC is determined after the second temperature sensor indicates that the operating temperature of the housing of the laser chip exceeds a second temperature range.

17. The system module according to claim 9, wherein a range of current over which the first TEC drive circuit is activated is different than a range of current over which the second TEC drive circuit is activated.

* * * * *